United States Patent
Toh et al.

(10) Patent No.: US 8,772,108 B1
(45) Date of Patent: Jul. 8, 2014

(54) MULTI-TIME PROGRAMMABLE NON-VOLATILE MEMORY

(71) Applicant: GLOBALFOUNDRIES Singapore Pte. Ltd., Singapore (SG)

(72) Inventors: Eng Huat Toh, Singapore (SG); Shyue Seng Tan, Singapore (SG); Elgin Quek, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 0 days.

(21) Appl. No.: 13/775,844

(22) Filed: Feb. 25, 2013

(51) Int. Cl.
*H01L 29/66* (2006.01)

(52) U.S. Cl.
USPC ............ 438/264; 438/266; 257/316; 257/319

(58) Field of Classification Search
USPC ............................ 257/316, 319; 438/264, 266
See application file for complete search history.

(56) References Cited

U.S. PATENT DOCUMENTS

| | | | | |
|---|---|---|---|---|
| 6,689,658 B2* | 2/2004 | Wu | ............................... | 438/257 |
| 6,977,411 B2* | 12/2005 | Ito et al. | ......................... | 257/318 |
| 7,056,785 B2* | 6/2006 | Hsu | ................................. | 438/248 |
| 7,087,955 B2* | 8/2006 | Kawashima et al. | ......... | 257/316 |
| 7,288,811 B2* | 10/2007 | Tsunoda et al. | ............... | 257/315 |
| 7,709,879 B2* | 5/2010 | Van Schaijk et al. | .......... | 257/314 |
| 7,811,887 B2* | 10/2010 | Irani et al. | ...................... | 438/262 |
| 8,168,524 B2* | 5/2012 | van Schaijk et al. | .......... | 438/593 |
| 8,334,559 B2* | 12/2012 | Akil et al. | ....................... | 257/316 |
| 8,383,476 B2* | 2/2013 | Jung et al. | ....................... | 438/201 |
| 2008/0121975 A1* | 5/2008 | Hsieh et al. | ..................... | 257/319 |
| 2012/0241840 A1* | 9/2012 | Lee et al. | ....................... | 257/319 |

* cited by examiner

*Primary Examiner* — Matthew W Such
*Assistant Examiner* — Stephen C Smith
(74) *Attorney, Agent, or Firm* — Ditthavong & Steiner, P.C.

(57) ABSTRACT

A process for creating a low-cost multi-time programmable (MTP) non-volatile memory (NVM) and the resulting device are provided. Embodiments include forming a select gate and a floating gate above a substrate, each over a first shallow trench isolation (STI) region, a doped region formed between a source and a drain, and a second STI region, forming a metal layer over the floating gate, and forming a pair of self-aligned contacts on the first and second STI regions on opposite sides of the doped region, respectively, and electrically connected to the metal layer.

20 Claims, 15 Drawing Sheets

FIG. 7C

MULTI-TIME PROGRAMMABLE NON-VOLATILE MEMORY

TECHNICAL FIELD

The present disclosure relates to forming multi-time programmable (MTP) non-volatile memory (NVM). The present disclosure is particularly applicable to forming low-cost MTP NVM.

BACKGROUND

The employment of NVM in high-volume system-on-chips (SoCs) for televisions, computers, and mobile devices has become increasingly popular. NVM is used to store a wide range of information, such as encryption keys, trimming values, configuration settings, memory patching, and firmware (e.g., test code, boot code, and application code).

One-time programmable (OTP) NVM has been employed in many applications. Conventional OTP NVM cells can use a floating gate as a storage medium and can be programmed only one time. Thus, no device update is possible.

Yet, there are many high-value applications that require the device to be updated, such as firmware updates for mobile devices, televisions, and other electronic devices. Thus, there are many applications that require MTP NVM. However, existing MTP solutions include dual poly-gate NVM or charge-trapping type poly-silicon-oxide-silicon nitride-oxide-silicon (SONOS) NVM, which require additional masking steps and process complexity, which in turn increases cost.

A need therefore exists for a methodology enabling fabrication of a low-cost MTP NVM utilizing a minimum of masks, and the resulting device.

SUMMARY

An aspect of the present disclosure is a methodology utilizing a self-aligned contact (SAC) for producing a MTP NVM.

Another aspect of the present disclosure is a low-cost MTP NVM.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a select gate and a floating gate above a substrate, each over a first shallow trench isolation (STI) region, a doped region formed between a source and a drain, and a second STI region, forming a metal layer over the floating gate, and forming a pair of SACs on the first and second STI regions on opposite sides of the doped region, respectively, and electrically connected to the metal layer.

Aspects of the present disclosure include forming a pair of spacers on opposite sides of the floating gate, forming a hardmask above the floating gate and between the pair of spacers, and forming the pair of SACs partially covering the hardmask and one spacer of the pair spacers. Another aspect includes forming the pair of spacers having rounded corners at top surfaces opposite the hardmask. An additional aspect includes forming the pair of spacers and the hardmask having co-planar top surfaces. A further aspect includes forming a second pair of SACs on the first and second STI regions, on opposite sides of the doped region, respectively, along a second side of the floating gate across the floating gate from the first pair of SACs and electrically connected to the first metal layer. Additional aspects include forming a pair of blocking layers on opposite sides of the floating gate, forming a hardmask above the floating gate and between the pair of blocking layers, and forming the first and second self-aligned contacts over the pair of blocking layers and partially covering the hardmask. An additional aspect includes forming the pair of blocking layers of oxide, oxide-nitride-oxide (ONO), or a combination thereof. Further aspects include forming a second metal layer over the doped region, the source, and the drain and above the first metal layer, and forming a bit line contact connecting the second metal layer to the drain.)

Another aspect of the present disclosure is an apparatus including: a doped region formed between a source and a drain within a substrate, first and second STI regions on opposite sides of the doped region, a select gate and a floating gate each over the first STI region, the doped region, and the second STI region, a metal layer over the floating gate, and a pair of SACs formed along one side of the floating gate on the first and second STI regions on opposite sides of the doped region, respectively, and electrically connected to the metal layer.

Aspects of the present disclosure include a pair of spacers on opposite sides of the floating gate, and a hardmask above the floating gate and between the pair of spacers, wherein the pair of SACs partially cover the hardmask and one spacer of the pair spacers. Another aspect includes the pair of spacers having rounded corners at top surfaces opposite the hardmask. An additional aspect includes top surfaces of the pair of spacers and the hardmask being co-planar. Yet another aspect includes a second pair of SACs formed on the first and second STI regions, on opposite sides of the doped region, respectively, along a second side of the floating gate across the floating gate from the first pair of SACs and electrically connected to the first metal layer. Additional aspects include a pair of blocking layers on opposite sides of the floating gate, and a hardmask above the floating gate and between the pair of blocking layers, wherein the first and second SACs are formed over the pair of blocking layers and partially cover the hardmask layer. An additional aspect includes the doped region including a P-type channel and/or an N-type channel. Additional aspects include a second metal layer over the doped region, the source, and the drain and above the first metal layer, and a bit line contact connecting the second metal layer to the drain.

Another aspect of the present disclosure is a method including forming a select gate and a floating gate above a substrate, each over a first STI region, a doped region formed between a source and a drain, and a second STI region, forming a first metal layer over the floating gate, forming two pairs of self-aligned contacts on the first and second STI regions, respectively, electrically connected to the first metal layer with SACs of each pair being on opposite sides of the floating gate and the two pairs of SACs being on opposite sides of the doped region, forming a second metal layer over the doped region, the source, and the drain and above the first metal layer, and forming a bit line contact connecting the second metal layer to the drain.

Aspects of the present disclosure further include forming a pair of spacers on opposite sides of the floating gate, forming a hardmask above the floating gate and between the pair of spacers, and forming each SAC of the two pairs of SACs partially covering the hardmask and one spacer of the pair of spacers. Additional aspects include forming a pair of blocking layers on opposite sides of the floating gate, forming a hardmask above the floating gate and between the pair of blocking layers, and forming each SAC of the two pairs of SACs partially covering the hardmask and one blocking layer of the pair of blocking layers.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawings and in which like reference numerals refer to similar elements and in which:

FIGS. 1A through 4B illustrate a process for forming a low-cost MTP NVM, in accordance with an exemplary embodiment;

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of additional masking steps and process complexity and the associated cost attendant upon creating MTP NVMs. In accordance with embodiments of the present disclosure, a select gate and a floating gate are formed above a substrate, each one being over a STI region, a doped region formed between a source and a drain, and a second STI region. A pair of self-aligned contacts is formed on the first and second STI regions on opposite sides of the doped region, respectively. Next, a metal layer is formed over the floating gate and electrically connected to the pair of self-aligned contacts. The resulting structure is a low-cost MTP NVM.

Figure 1A:
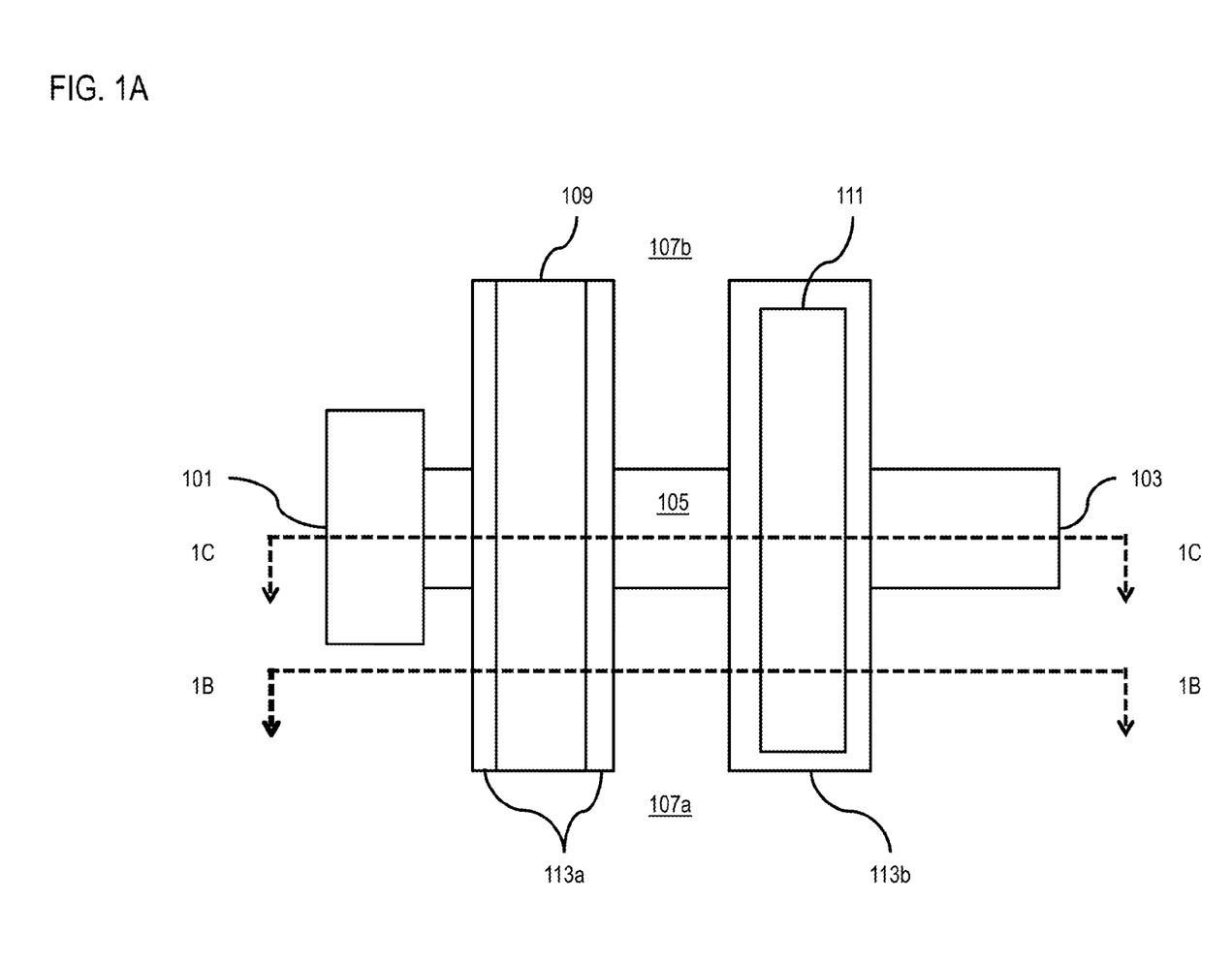
Figure 1B:
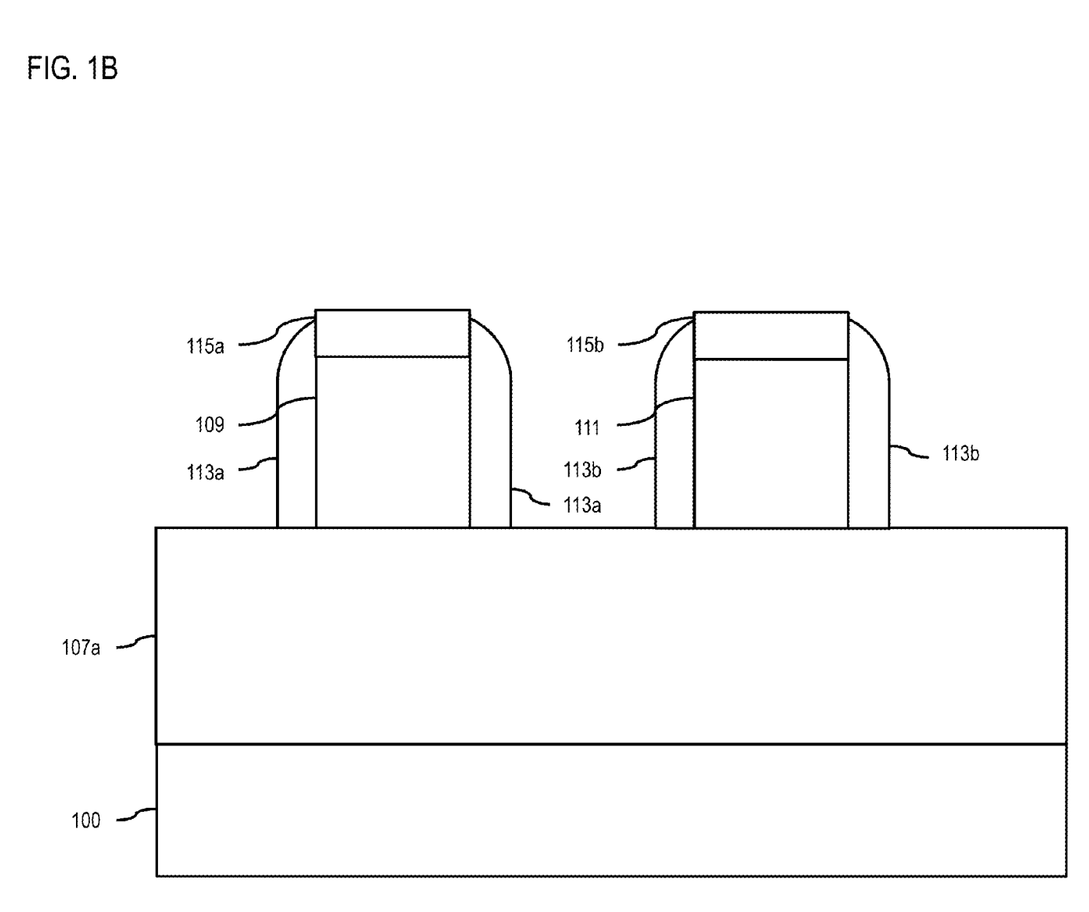
Figure 1C:
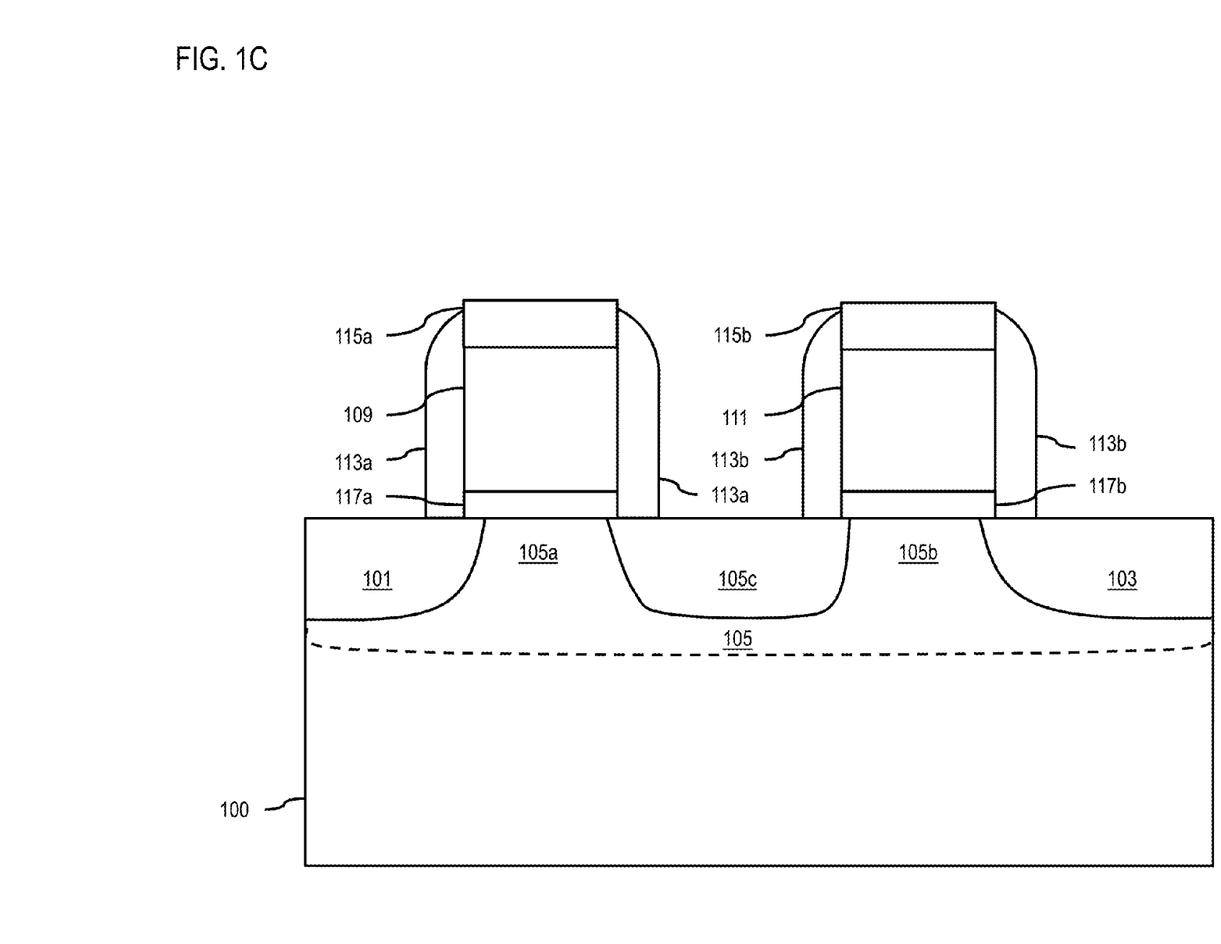

Adverting to FIGS. 1A through 1C, a method for forming a low-cost MTP NVM, according to an exemplary embodiment, is shown, with FIG. 1B illustrating the cross-section along line 1B-1B in FIG. 1A, and with FIG. 1C illustrating the cross-section along line 1C-1C in FIG. 1A. The method begins with a dual gate NVM that includes a source 101 and a drain 103 formed in a substrate 100. A doped region 105 is formed within the substrate 100 by doping an active area of the substrate 100. On either side of the doped region 105 are STI regions 107a and 107b that are at least partially buried in the substrate 100. The STI regions 107a and 107b may be formed of a dielectric, such as silicon dioxide ($SiO_2$), and may define a boundary of the source 101, the drain 103, and the doped region 105 (i.e., may surround the active area). Formed on the top surface of the substrate 100 and over the STI regions 107a and 107b and the doped region 105 are a select gate 109 and a floating gate 111. The select gate 109 and the floating gate 111 each can be a poly-silicon (Si) gate or a replaceable gate to be replaced by a high-k dielectric, metal gate. Below the select gate 109 and the floating gate 111 are gate oxide layers 117a and 117b. The gate oxide layer 117a may be a select gate oxide layer and the gate oxide layer 117b may be a tunnel oxide layer. Below the select gate 109 within the doped region 105 is a select gate channel 105a, and below the floating gate 111 within the doped region 105 is a floating gate channel 105b. Within the doped region 105 between the select gate channel 105a and the floating gate channel 105b is a source/drain or floating node 105c. The floating node 105c may be formed at the same time as forming the source 101 and the drain 103. The source 101 and the drain 103 can be doped N-type for an n-channel device with the substrate 100 with a well or doped region 105 doped P-type. On sides of the select gate 109 and the floating gate 111 are pairs of spacers 113a and 113b, respectively. As illustrated in FIGS. 1B and 1C, the tops of the spacers 113a and 113b may be rounded. The spacers 113a and 113b may be formed of a dielectric material, such as nitride, oxide/nitride, or ONO. The spacers 113a may be formed of a different dielectric material than the spacers 113b (e.g., spacers 113a could be nitride and spacers 113b could be ONO). Also illustrated in FIGS. 1B and 1C, above the select gate 109 and the floating gate 111 and between the pairs of spacers 113a and 113b are hardmasks 115a and 115b. The hardmasks 115a and 115b may be formed of an oxide and/or nitride.

Figure 2A:
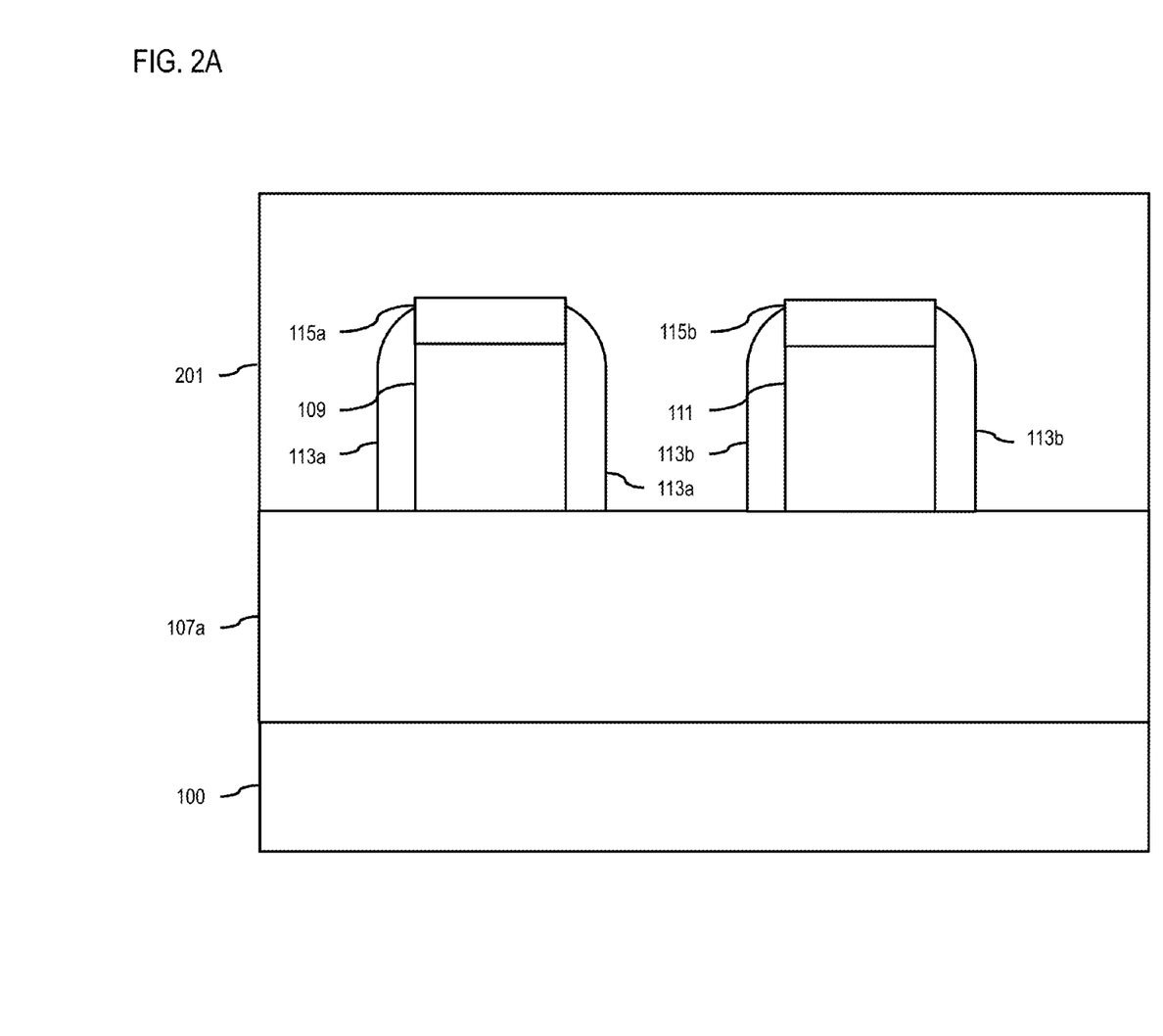
Figure 2B:
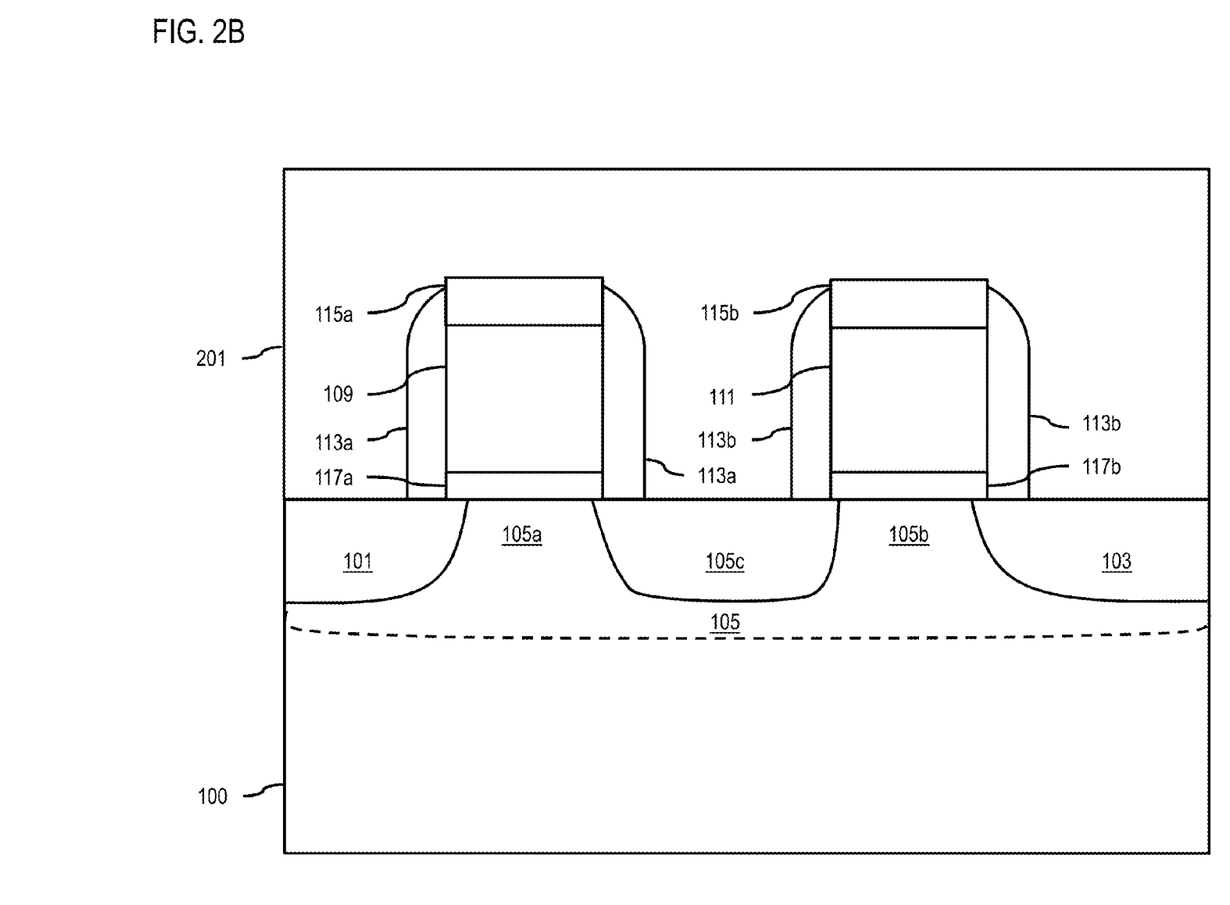

Next, as illustrated in FIGS. 2A and 2B, inter-layer dielectric (ILD) 201 may be formed over the substrate 100, covering the STI regions 107a and 107b, the pairs of spacers 113a and 113b, and the hardmasks 115a and 115b. The ILD 201 may be formed of any ILD material. In the case of a replaceable gate for either select gate 109 or floating gate 111, ILD 201 would then be planarized down to hardmasks 115a and 115b, and the hardmask and replaceable gate would be removed and replaced with a high-k dielectric, metal gate, and new hardmask, by conventional techniques. Next, additional ILD material may be deposited over the entire substrate 100, such that the total ILD material would have the same thickness as ILD 201 of FIGS. 2A and 2B. Alternatively, additional ILD material may not be deposited prior to the next process step.

Figure 3A:
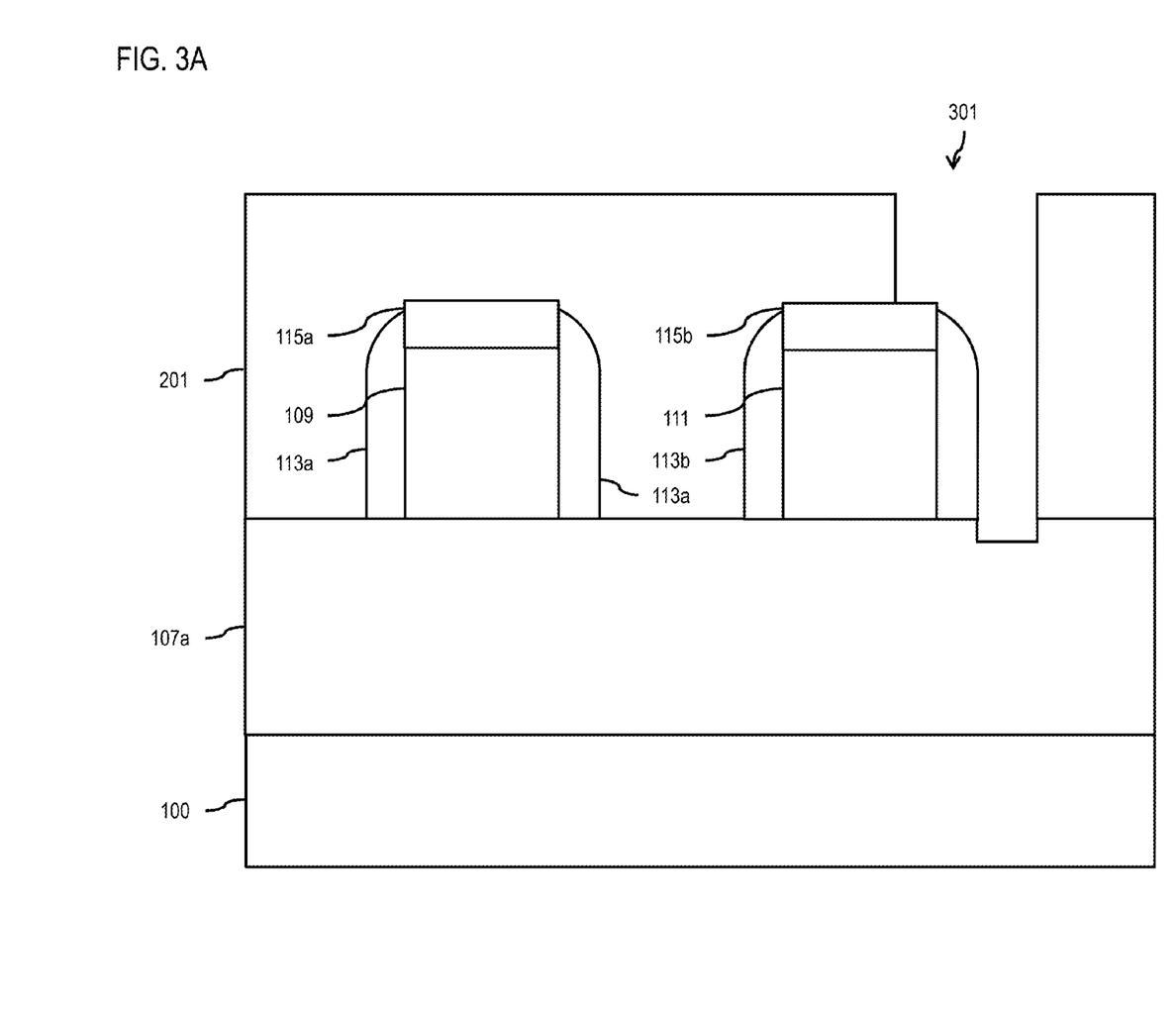
Figure 3B:
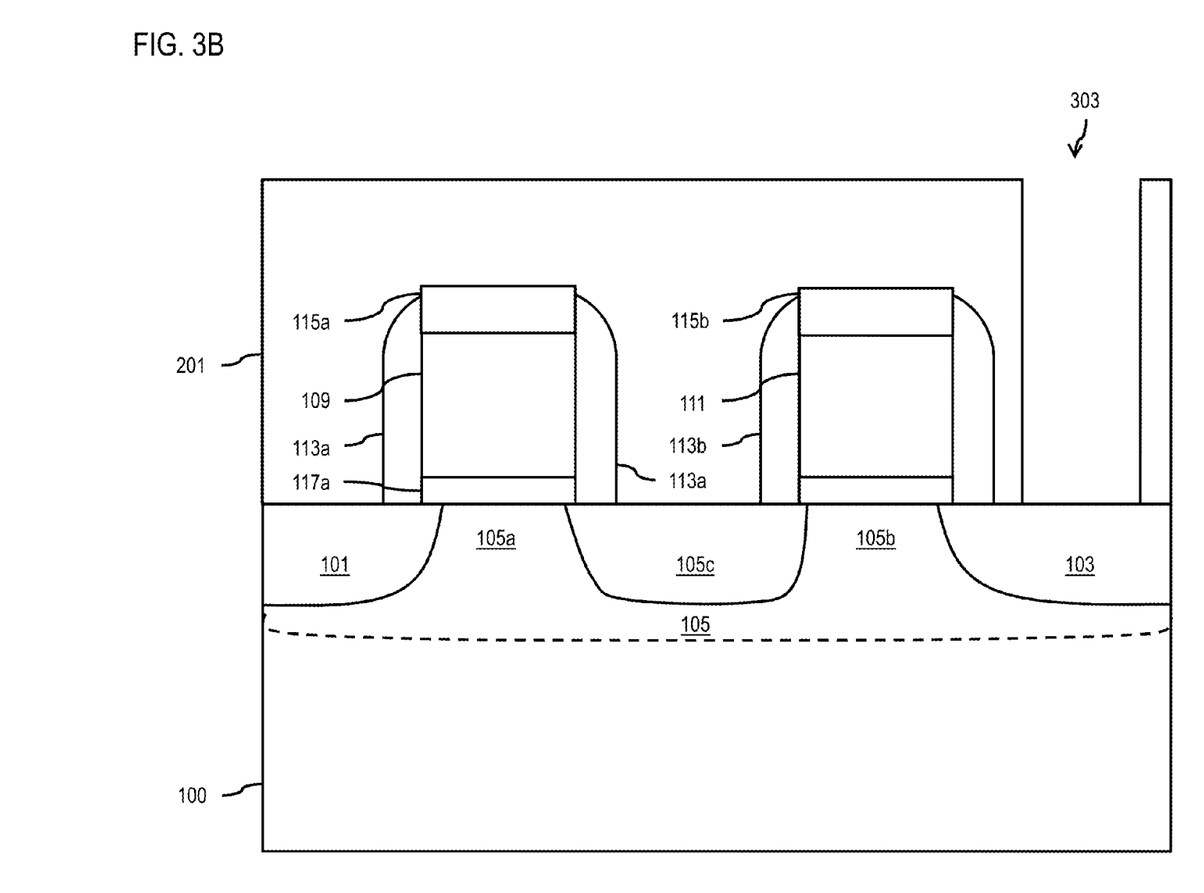

After forming the ILD 201 (and any high-k dielectric and metal gates), a cavity 301 is formed within the ILD 201 over the STI region 107a, as illustrated in FIG. 3A. An additional cavity is formed within the ILD 201 over the STI region 107b (not shown for illustrative convenience) on the opposite side of the doped region 105. A bit line cavity 303 is formed within the ILD 201 over the drain 103, as illustrated in FIG. 3B. The cavity 301 and the bit line cavity 303 may be formed according to any conventional processing, such as by forming and patterning a hardmask over the ILD 201 and etching the ILD 201 through the hardmask. The hardmask formed over the ILD 201 can be an oxide and/or nitride etch stop layer (ESL). In forming the cavity 301, a portion of the STI region 107a may be removed, as illustrated. However, partial removal of the STI region 107a is not required. The cavity 301 exposes a portion of the hardmask 115b over the floating gate 111 and a spacer of the pair of spacers 113b associated with the floating gate 111.

Figure 4A:
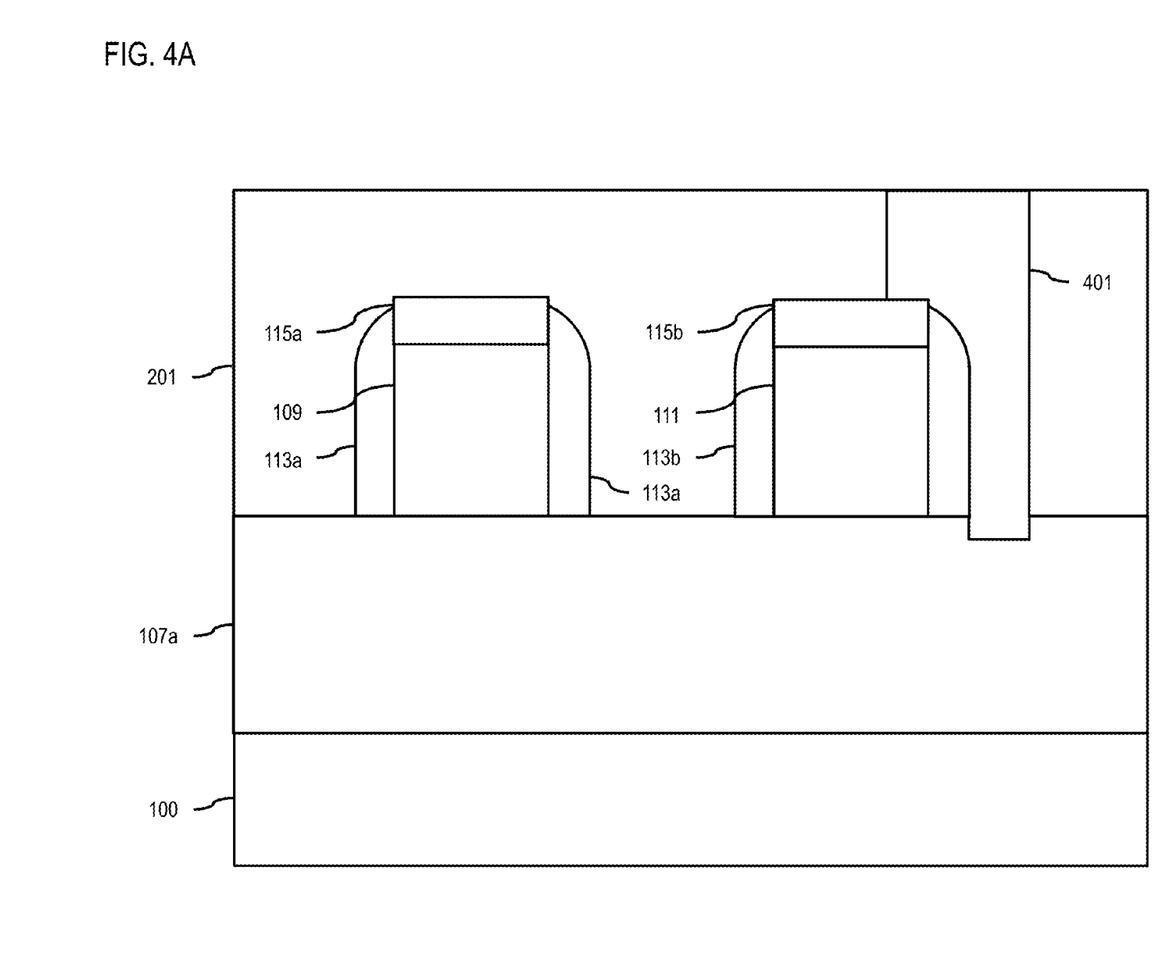
Figure 4B:
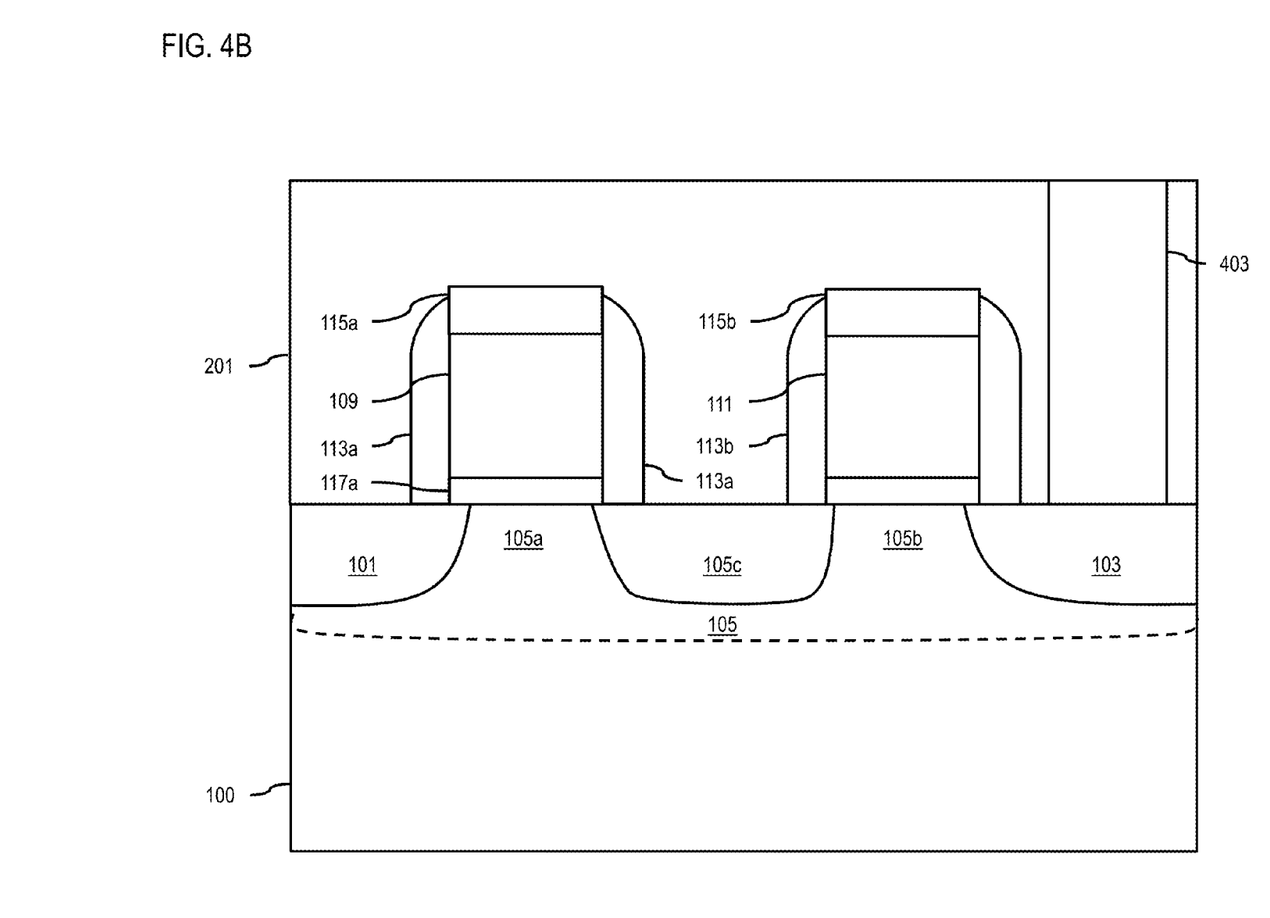

Next, the cavity 301 and the complementary cavity over the STI region 107b, as well as the bit line cavity 303, are filled with a metal to form a pair of SACs 401 over the STI regions 107a and 107b and a bit line contact 403 over the drain 103, as illustrated in FIGS. 4A and 4B. Since SACs require no additional masks, by using a self-aligned process, the contacts 401 can be formed at a relatively low cost or at no cost at all.

Figure 5A:
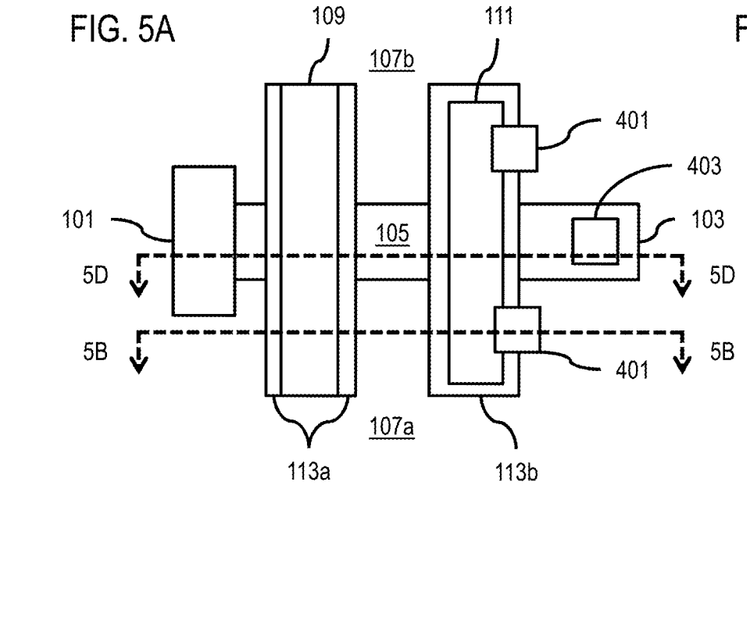
FIG. 5A illustrates a schematic of a low-cost MTP NVM, in accordance with an exemplary embodiment.
Figure 5B:
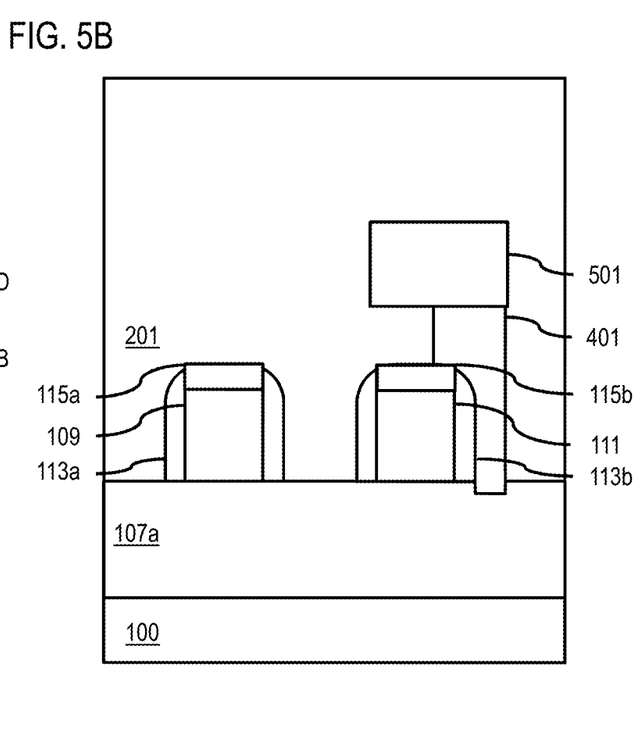
FIG. 5B illustrates a cross-sectional view of the low-cost MTP NVM of FIG. 5A.
Figure 5C:
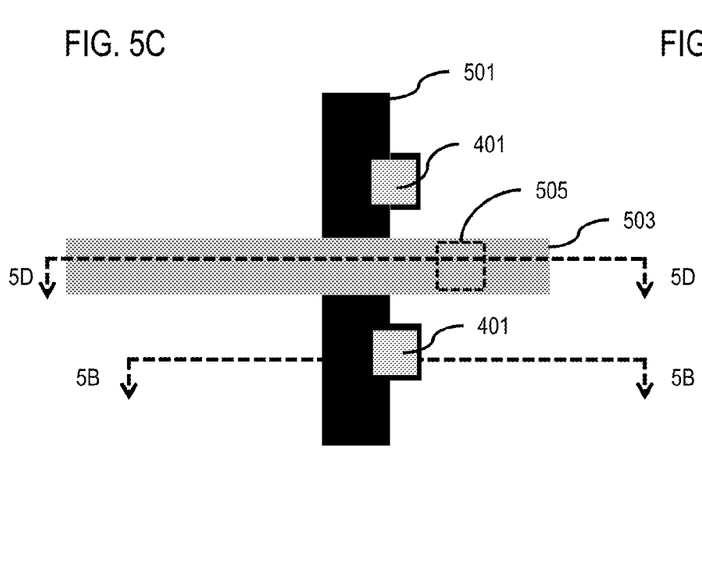
FIG. 5C illustrates a schematic of metal lines associated with the low-cost MTP NVM of FIG. 5A.
Figure 5D:
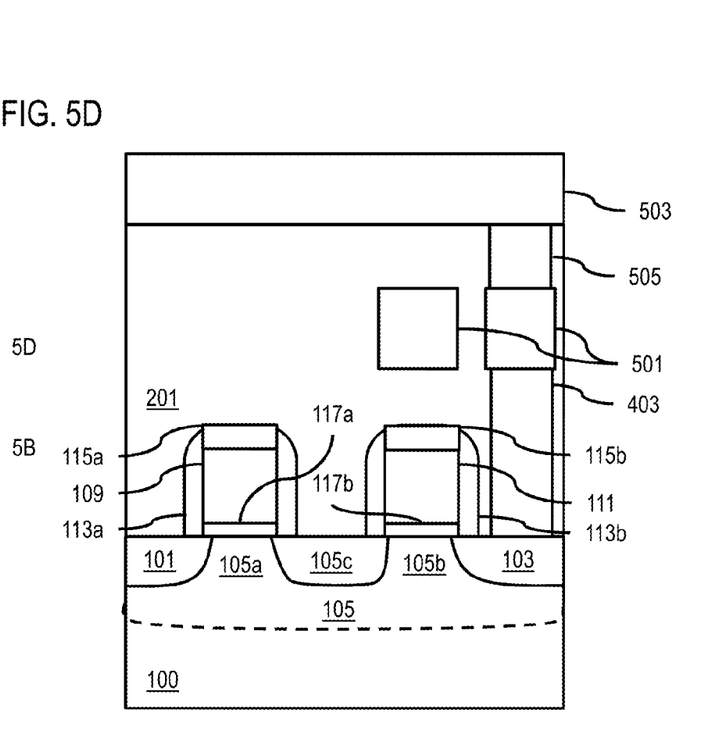
FIG. 5D illustrates another cross-sectional view of the low-cost MTP NVM of FIG. 5A.

FIG. 5A illustrates a schematic view of the resulting structure of the process illustrated in FIGS. 1A through 4B. FIG. 5B illustrates a cross-sectional view of the resulting structure of the process illustrated in FIGS. 1A through 4B along the line 5B-5B in FIG. 5A. FIG. 5D illustrates another cross-sectional view of the resulting structure of the process illustrated in FIGS. 1A through 4B along the line 5D-5D in FIG. 5A. As seen in FIGS. 5A and 5B, the pair of SACs 401 are above the STI regions 107a and 107b and on opposite sides of the doped region 105 above the floating gate 111. Further, as illustrated in FIGS. 5B and 5C, the SACs 401 are electrically connected to a first metal layer 501 (e.g., M1), which is above the structure illustrated in FIG. 5A. Further, the bit line contact 403 illustrated in FIG. 5D is electrically connected to a second metal layer 503 (e.g., M2) through the first metal layer 501 and a vertical interconnect access (VIA) 505. The second metal layer 503 may be above and parallel the doped region 105 illustrated in FIGS. 5A and 5B and may be above and perpendicular to the first metal layer 501. The resulting structure is a low-cost MTP NVM. Programming may be performed similar to conventional OTP NVM programming, such as through hot carrier injection (HCI), and/or the SACs 401 can be used as a coupling programming gate. Further, erase can be performed through the SACs 401 according to an enhanced corner effect with the charge escaping the corners of the floating gate 111 between the hardmask 115b and the pair of spacers 113b. Alternatively, erase can be performed through the doped region 105 using the SACs 401 as a coupling gate.

Figure 5E:
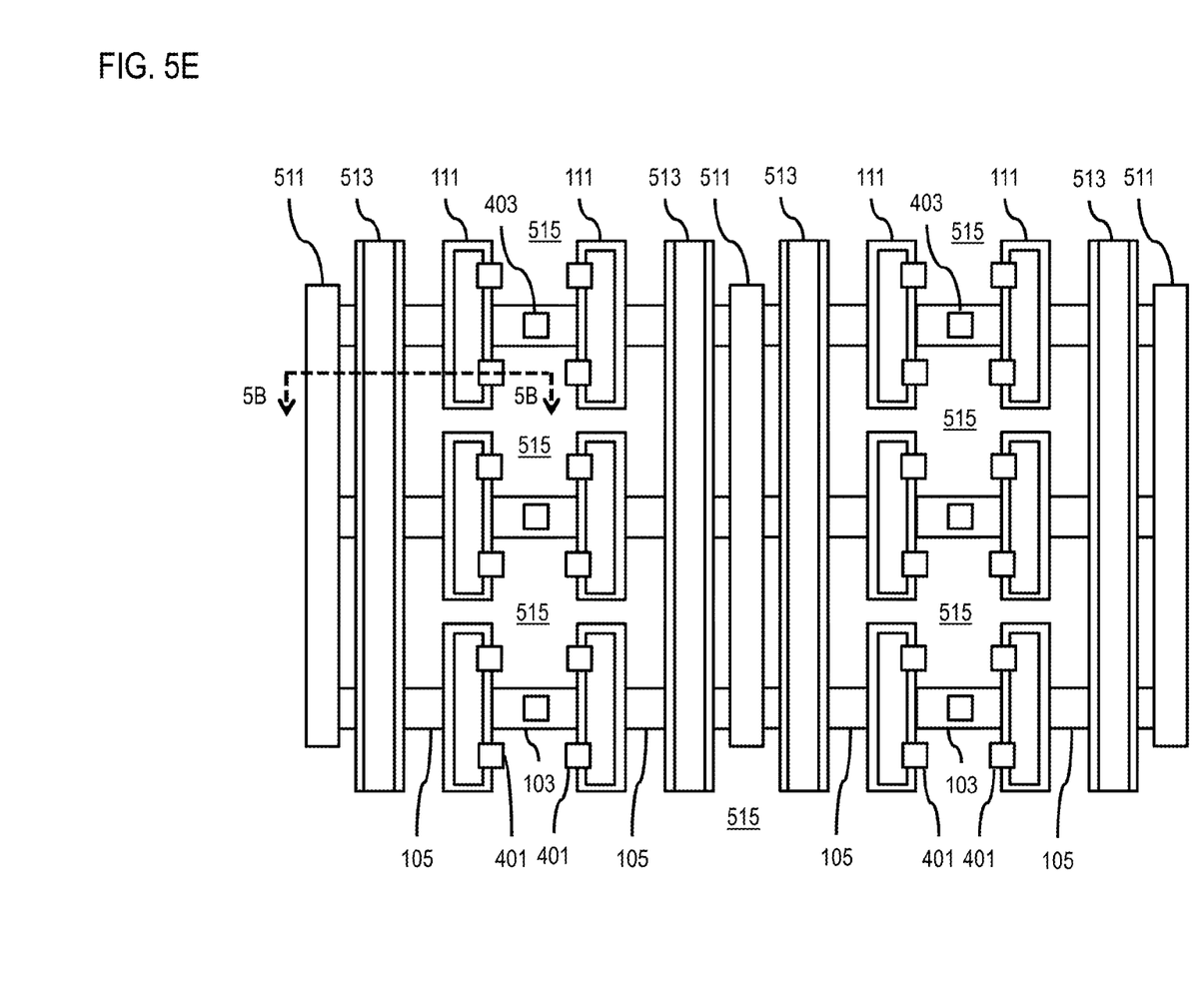
FIG. 5E illustrates a schematic of an array of a low-cost MTP NVM illustrated in FIG. 5A.

FIG. 5E illustrates a schematic of an array of the dual gate NVM illustrated in FIG. 5A. As illustrated, the array may include vertical source lines 511 that correspond to a source 101 for each dual gate NVM. Further, a select gate 109 may correspond to and extend across multiple doped regions 105, as illustrated by the select gates 513. Horizontally adjacent dual gate NVMs may share drains 103 and bit line contacts 403 for connecting to horizontal metal lines that constitute the second metal layer 503. Further, surrounding the source lines 511, the doped regions 105, the select gates 513, and the floating gates 111 (i.e., surrounding the active area) are STI regions 515, which include the STI regions 107a and 107b.

Figure 6A:
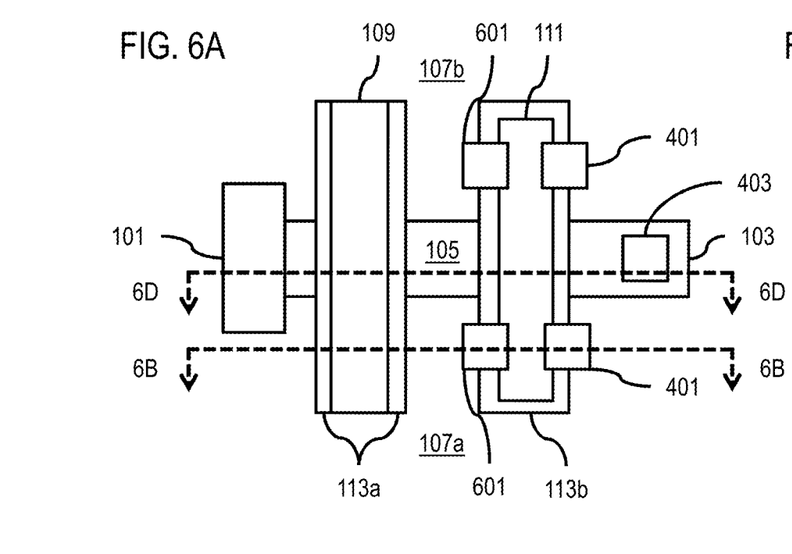
FIG. 6A illustrates a schematic of a low-cost MTP NVM, in accordance with another exemplary embodiment.
Figure 6B:
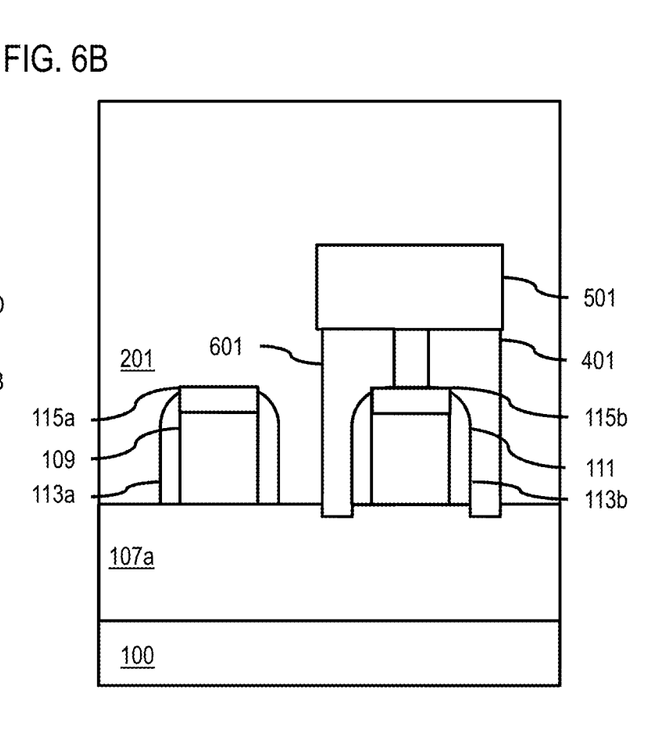
FIG. 6B illustrates a cross-sectional view of the low-cost MTP NVM of FIG. 6A.

FIG. 6A illustrates a schematic view of an alternative MTP NVM structure that can be formed according to a modification of the above-described process. FIG. 6B illustrates a cross-sectional view of the structure of FIG. 6A along the line 6B-6B in FIG. 6A. As illustrated, a second pair of SACs 601 can be formed on the opposite side of the floating gate 111 from the SACs 401 to form a total of four SACs, with two on each side of the floating gate 111 and two on each side of the doped region 105. The second pair of SACs 601 is also formed over the STI regions 107a and 107b.

Figure 6C:
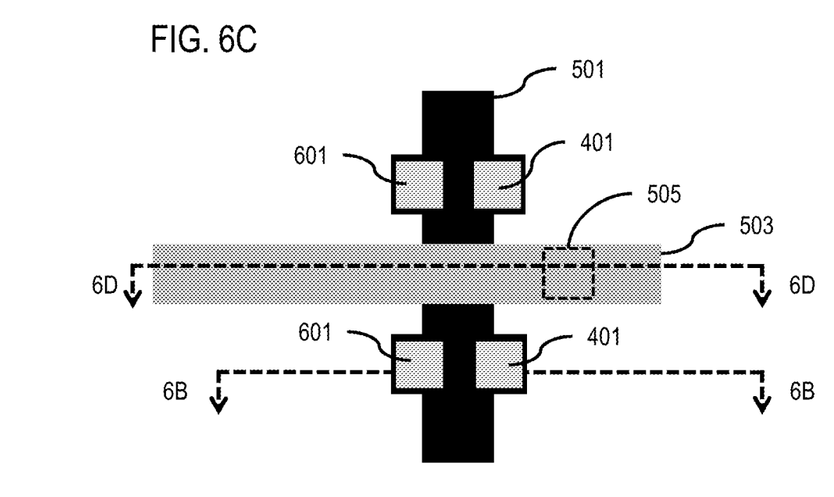
FIG. 6C illustrates a schematic of metal lines associated with the low-cost MTP NVM of FIG. 6A.

To form the second pair of SACs 601, the hardmask discussed above used in forming the cavity 301 may be patterned to account for the second pair of SACs 601 (e.g., form four cavities). Further, the second pair of SACs 601 is also connected to the first metal layer 501, as illustrated in FIG. 6C. Including the second pair of SACs 601 allows for better erase capability based on an enhanced corner effect. Further, although the cross sections of the SACs 401 and 601 are illustrated as being square, the SACs 401 and 601 can have different cross-sectional dimensions.

Figure 7A:
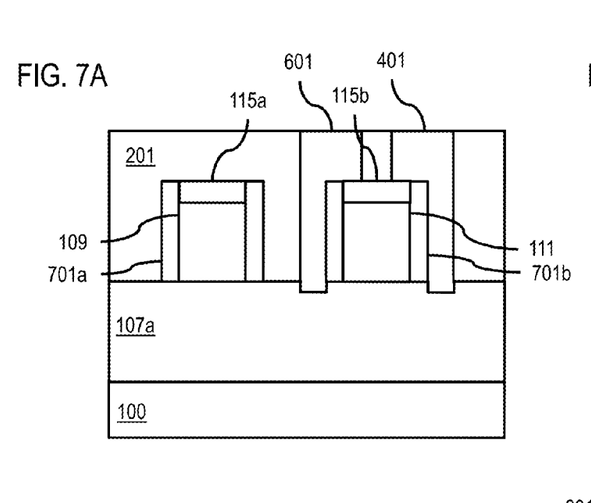
FIGS. 7A through 7C illustrate cross-sectional views of low-cost MTP NVMs, in accordance with various exemplary embodiments.
Figure 7B:
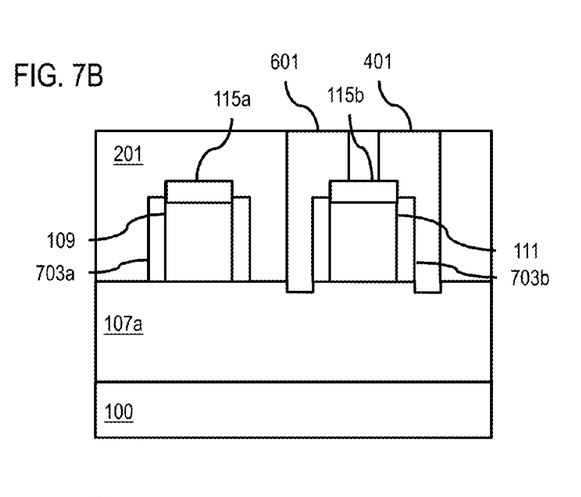
Figure 7C:
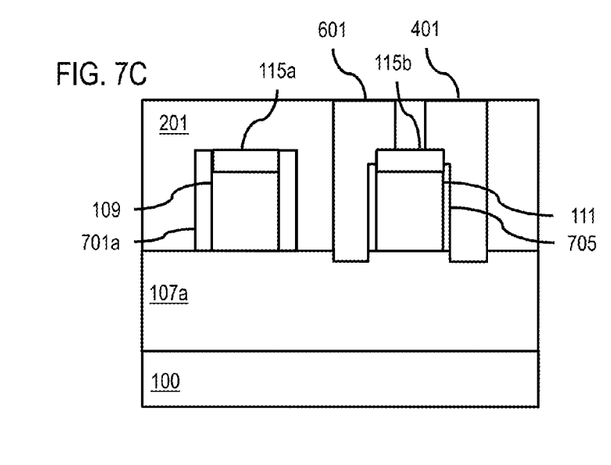

FIGS. 7A through 7C illustrate three alternative structures to the structure illustrated in FIG. 6B. As illustrated in FIG. 7A, rather than being rounded, the pairs of spacers 701a and 701b on either side of the select gate 109 and the floating gate 111, respectively, may be co-planar with the top surfaces of the hardmasks 115a and 115b. Alternatively, as illustrated in FIG. 7B, the pairs of spacers 703a and 703b on either side of the select gate 109 and the floating gate 111, respectively, may be planar and extend above the top surfaces of the select gate 109 and the floating gate 111 but below the top surfaces of the hardmasks 115a and 115b. The height of the spacers can be set so as to control the loss of charge while being low enough during an erase to allow for the removal of the charge through the corners. The variations between the structure illustrated in FIG. 6B and the structures illustrated in FIGS. 7A and 7B allow for tuning the thickness of the spacers at the corners of the floating gate 111 so as to enhance the Fowler-Nordheim tunneling. The thinner the spacers, the more the Fowler-Nordheim tunneling increases. Further, as illustrated in FIG. 7C, the thickness of the blocking layers 705, which may also be considered spacers, around the floating gate 111 can be formed thinner than the thickness of the spacers 701 a surrounding the select gate 109. In this embodiment, the original spacers 113b may be removed when, or subsequently after, forming the cavity 301. The blocking layers 705 may be subsequently formed within the cavity 301 prior to filing the cavity with metal to form the SACs 401. The blocking layers 705 may be formed of a different dielectric than the spacers 701a (e.g., spacers 701a could be nitride and the blocking layers 705 could be ONO). By tuning the spacer thickness, the corner electric field could reach values of 1E6 volts per centimeter (V/cm), whereas the electric field at the sides and the top are much lower than the tunneling electric field. The thickness selected for the spacers, both at the corners and at the sides, can depend on the voltage applied.

The embodiments of the present disclosure achieve several technical effects, including a low cost MTP NVM formed by a method requiring few to none additional masks. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
forming a select gate and a floating gate above a substrate, each over a first shallow trench isolation (STI) region, a doped region formed between a source and a drain, and a second STI region;
forming a metal layer over the floating gate; and
forming a pair of self-aligned contacts on the first and second STI regions on opposite sides of the doped region, respectively, and electrically connected to the metal layer.

2. The method according to claim 1, further comprising:
forming a pair of spacers on opposite sides of the floating gate;
forming a hardmask above the floating gate and between the pair of spacers; and
forming the pair of self-aligned contacts partially covering the hardmask and one spacer of the pair spacers.

3. The method according to claim 2, comprising:
forming the pair of spacers having rounded corners at top surfaces opposite the hardmask.

4. The method according to claim 2, comprising:
forming the pair of spacers and the hardmask having co-planar top surfaces.

5. The method according to claim 1, further comprising:
forming a second pair of self-aligned contacts on the first and second STI regions, on opposite sides of the doped region, respectively, along a second side of the floating gate across the floating gate from the first pair of self-aligned contacts and electrically connected to the first metal layer.

6. The method according to claim 5, further comprising:
forming a pair of blocking layers on opposite sides of the floating gate;
forming a hardmask above the floating gate and between the pair of blocking layers; and
forming the first and second self-aligned contacts over the pair of blocking layers and partially covering the hardmask layer.

7. The method according to claim 6, comprising:
forming the pair of blocking layers of oxide, oxide-nitride-oxide (ONO), or a combination thereof.

8. The method according to claim 1, further comprising:
forming a second metal layer over the doped region, the source, and the drain and above the first metal layer; and
forming a bit line contact connecting the second metal layer and the drain.

9. A device comprising:
a doped region formed between a source and a drain within a substrate;
first and second shallow trench isolation (STI) regions on opposite sides of the doped region;
a select gate and a floating gate each over the first STI region, the doped region, and the second STI region;
a metal layer over the floating gate; and
a pair of self-aligned contacts formed along one side of the floating gate on the first and second STI regions on opposite sides of the doped region, respectively, and electrically connected to the metal layer.

10. The device according to claim 9, further comprising:
a pair of spacers on opposite sides of the floating gate; and
a hardmask above the floating gate and between the pair of spacers,
wherein the pair of self-aligned contacts partially cover the hardmask and one spacer of the pair spacers.

11. The device according to claim 10, comprising:
the pair of spacers having rounded corners at top surfaces opposite the hardmask layer.

12. The device according to claim 10, comprising:
top surfaces of the pair of spacers and the hardmask being co-planar.

13. The device according to claim 9, further comprising:
a second pair of self-aligned contacts formed on the first and second STI regions, on opposite sides of the doped region, respectively, along a second side of the floating gate across the floating gate from the first pair of self-aligned contacts and electrically connected to the first metal layer.

14. The device according to claim 13, further comprising:
a pair of blocking layers on opposite sides of the floating gate; and
a hardmask above the floating gate and between the pair of blocking layers,
wherein the first and second self-aligned contacts are formed over the pair of blocking layers and partially cover the hardmask layer.

15. The device according to claim 9, comprising:
the doped region including a P-type channel.

16. The device according to claim 9, comprising:
the doped region including an N-type channel.

17. The device according to claim 9, further comprising:
a second metal layer over the doped region, the source, and the drain and above the first metal layer; and
a bit line contact connecting the second metal layer and the drain.

18. A method comprising:
forming a select gate and a floating gate above a substrate, each over a first shallow trench isolation (STI) region, a doped region formed between a source and a drain, and a second STI region;
forming a first metal layer over the floating gate;
forming two pairs of self-aligned contacts on the first and second STI regions, respectively, electrically connected to the first metal layer with self-aligned contacts of each pair being on opposite sides of the floating gate and the two pairs of self-aligned contacts being on opposite sides of the doped region;
forming a second metal layer over the doped region, the source, and the drain and above the first metal layer; and
forming a bit line contact connecting the second metal layer and the drain.

19. The method according to claim 18, further comprising:
forming a pair of spacers on opposite sides of the floating gate;
forming a hardmask above the floating gate and between the pair of spacers; and
forming each self-aligned contact of the two pairs of self-aligned contacts partially covering the hardmask and one spacer of the pair of spacers.

20. The method according to claim 18, further comprising:
forming a pair of blocking layers on opposite sides of the floating gate;
forming a hardmask above the floating gate and between the pair of blocking layers; and
forming each self-aligned contact of the two pairs of self-aligned contacts partially covering the hardmask and one blocking layer of the pair of blocking layers.

* * * * *